US008098067B2

(12) United States Patent  
Hasunuma

(10) Patent No.: US 8,098,067 B2  
(45) Date of Patent: Jan. 17, 2012

(54) MAGNETIC SENSOR ELEMENT AND MAGNETIC SENSOR USING THE SAME

(75) Inventor: Takashi Hasunuma, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 463 days.

(21) Appl. No.: 12/295,577

(22) PCT Filed: Mar. 29, 2007

(86) PCT No.: PCT/JP2007/000330  
§ 371 (c)(1),  
(2), (4) Date: Sep. 30, 2008

(87) PCT Pub. No.: WO2007/116583  
PCT Pub. Date: Oct. 18, 2007

(65) Prior Publication Data  
US 2009/0243609 A1   Oct. 1, 2009

(30) Foreign Application Priority Data  
Mar. 31, 2006   (JP) .................................. 2006-099323

(51) Int. Cl.  
*G01R 33/02* (2006.01)  
*G01R 33/05* (2006.01)

(52) U.S. Cl. ......... 324/249; 324/253; 324/258; 324/260
(58) Field of Classification Search ....... 324/207.11–207.25, 200–263  
See application file for complete search history.

(56) References Cited

U.S. PATENT DOCUMENTS

| 7,535,221 | B2 * | 5/2009 | Satoh ............................ 324/253 |
| 2003/0052671 | A1 * | 3/2003 | Kawase ........................ 324/249 |
| 2004/0027129 | A1 * | 2/2004 | Cull .............................. 324/326 |

FOREIGN PATENT DOCUMENTS

| JP | 07-014043 | 4/1995 |
| JP | 07-234269 | 9/1995 |
| JP | 08-179023 | 7/1996 |
| JP | 2003-004831 | 1/2003 |
| JP | 2004-184098 | 7/2004 |
| JP | 2004-198379 | 7/2004 |
| JP | 2004-271481 | 9/2004 |
| JP | 2005-114489 | 4/2005 |

* cited by examiner

*Primary Examiner* — Huy Q Phan  
*Assistant Examiner* — Emily Chan  
(74) *Attorney, Agent, or Firm* — Browdy and Neimark, PLLC

(57) ABSTRACT

The present invention provides a fluxgate magnetic sensor element which includes: a substrate; an exciting pattern which is disposed on the substrate to generate a magnetic field; a magnetic thin film pattern for detection which is disposed adjacent to the exciting pattern; and a detection coil pattern which is disposed adjacent to the magnetic thin film pattern for detection. In the magnetic sensor element, the exciting pattern, the magnetic thin film pattern for detection, and the detection coil pattern are formed on the substrate. Therefore, the magnetic sensor element can be formed into a flat shape. Moreover, since the length of the generated magnetic field is short in a long-axis direction, the size and thickness of the element itself can be reduced.

11 Claims, 8 Drawing Sheets

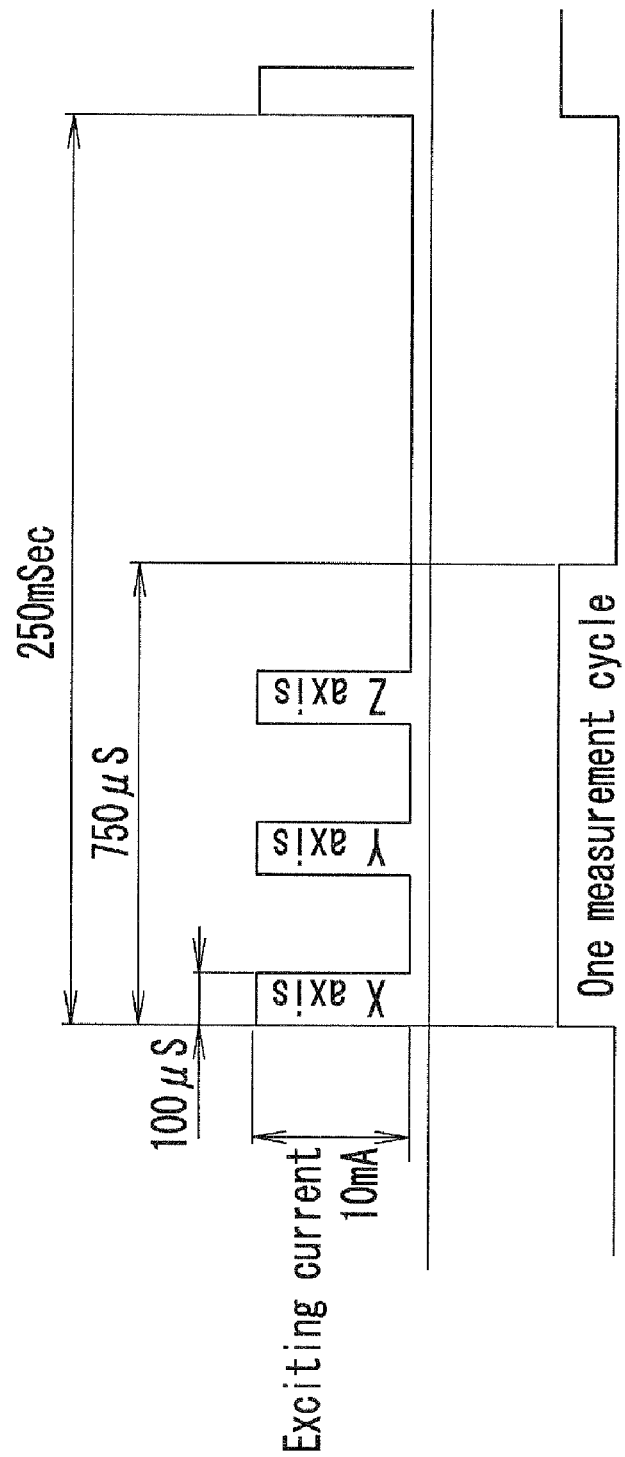

MAGNETIC SENSOR ELEMENT AND MAGNETIC SENSOR USING THE SAME

TECHNICAL FIELD

The present invention relates to a magnetic sensor element and to a magnetic sensor. More particularly, the invention relates to a fluxgate magnetic sensor element formed into a flat shape and to a magnetic sensor including the magnetic sensor element elements, which are orthogonally disposed.

BACKGROUND ART

Conventionally, as a magnetic sensor for detecting a weak magnetic field such as geomagnetism, an orthogonal fluxgate magnetic sensor is known. Examples of the orthogonal fluxgate magnetic sensor include those disclosed in Japanese Patent Application Laid-Open Nos. 2005-114489, 2004-271481, 2004-198379, and 2004-184098.

Such an orthogonal fluxgate magnetic sensor comprises a magnetic sensor element including a conductive body, a magnetic body disposed around the conductive body, and a detection coil wound around the magnetic body.

However, the orthogonal fluxgate magnetic sensor having the structure described above has problems in that it is difficult to reduce the size, particularly the thickness, of the magnetic sensor element and that the magnetic sensor element cannot be formed as an IC.

Japanese Patent Application Laid-Open No. 2003-004831 discloses a magnetic sensor including spiral-shaped coils and a rectangular stripe made of a magnetic material and disposed on the coils.

However, in the above magnetic sensor, since the stripe (stripe or strip) of the magnetic material is disposed on the square spiral-shaped coils with 2.5 mm sides, the generated magnetic field become longer in a long axis direction. Therefore, disadvantageously, it is difficult to reduce the size and thickness of the magnetic sensor.

DISCLOSURE OF THE INVENTION

Problems to be Solved by the Invention

A first object of the present invention is to reduce the size and thickness of a fluxgate magnetic sensor element.

A second object of the present invention is to reduce the size and thickness of a magnetic sensor in which fluxgate magnetic sensor elements are installed orthogonally.

Means for Solving the Problems

To achieve the above first object, a magnetic sensor element according to one embodiment of the present invention comprises: a substrate; an exciting pattern which is disposed on the substrate to generate a magnetic field; a magnetic thin film pattern which is for detection and disposed adjacent to the exciting pattern; and a detection coil pattern which is disposed adjacent to the magnetic thin film pattern for detection.

To achieve the above second object, a magnetic sensor according to one embodiment of the present invention comprises a plurality of magnetic sensor elements which are disposed on mutually orthogonal X, Y, and Z axes, wherein each of the plurality of magnetic sensor elements comprises: a substrate; an exciting pattern which is disposed on the substrate to generate a magnetic field; a magnetic thin film pattern for detection which is disposed adjacent to the exciting pattern; and a detection coil pattern which is disposed adjacent to the magnetic thin film pattern for detection.

Effects of the Invention

In the magnetic sensor element of the present invention, since the exciting pattern, the magnetic thin film pattern for detection, and the detection coil pattern are disposed on the substrate, the magnetic sensor element can be formed into a flat shape, and the length of the generated magnetic field is short in a long axis direction. Therefore, the size and thickness of the magnetic sensor element itself can be reduced.

In the magnetic sensor of the present invention, the above magnetic sensor elements can be compactly installed in the package of the magnetic sensor. Therefore, the size and thickness of the package itself can be reduced.

BRIEF DESCRIPTION OF THE DRAWINGS

FIG. 9 is a pattern diagram showing an example of the driving pattern of the magnetic sensor according to the present invention.

BEST MODE FOR CARRYING OUT THE INVENTION

Figure 1:
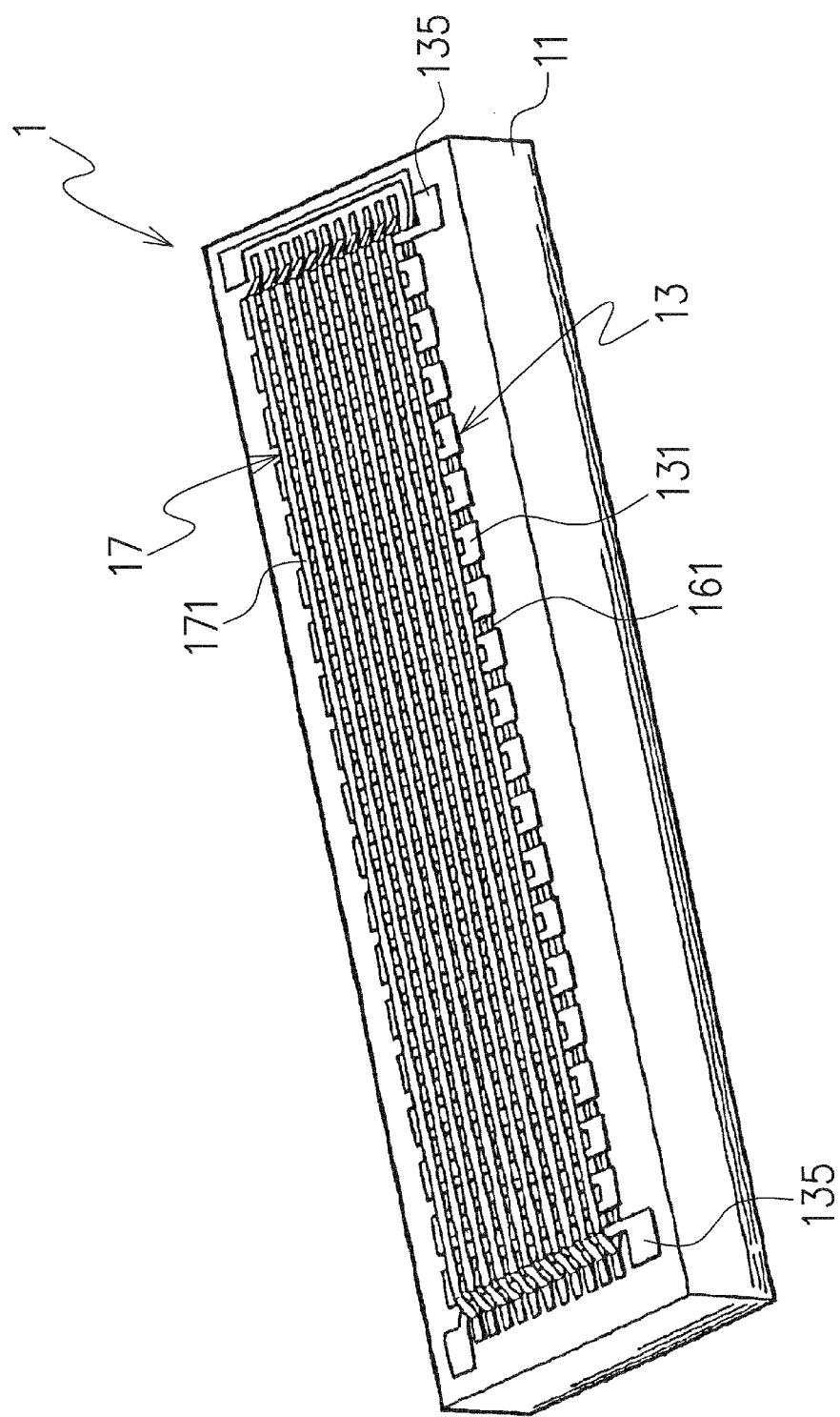
FIG. 1 is a perspective view illustrating a fluxgate magnetic sensor element according to a first embodiment of the present invention.

Hereinafter, the best mode of a magnetic sensor element and sensor according to the present invention will be described in detail by way of embodiments shown in the drawings.

First Embodiment

Figure 2:
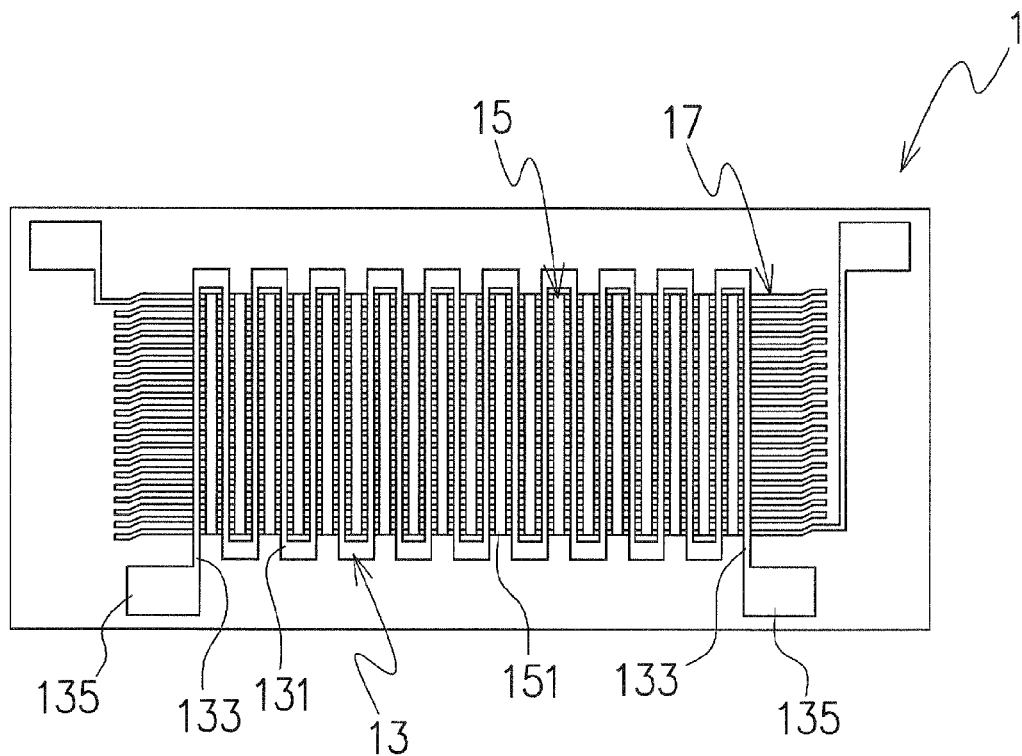
FIG. 2 is a plan view illustrating the fluxgate magnetic sensor element according to the first embodiment of the present invention, the magnetic sensor element being illustrated with part of a detection coil pattern removed.
Figure 3:
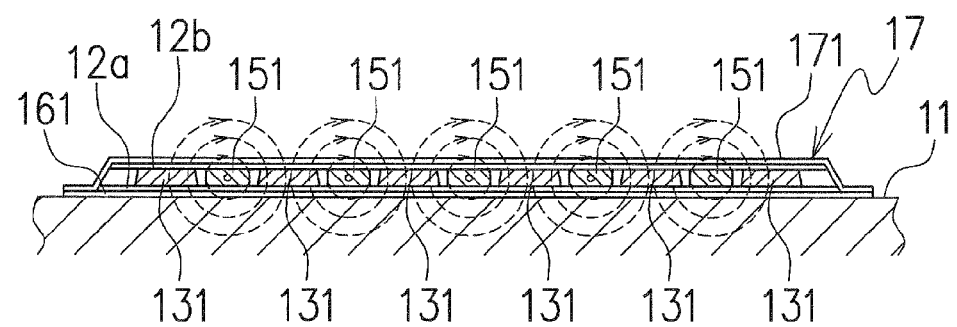
FIG. 3 is a cross-sectional view of the fluxgate magnetic sensor element according to the first embodiment of the present invention.

FIGS. 1 to 4 show a first embodiment of a magnetic sensor element according to the present invention. The magnetic sensor element in the first embodiment is, for example, a fluxgate magnetic sensor element 1 and includes, for example, a rectangular solid-shaped substrate 11 having a small thickness, as shown in FIGS. 1 and 3. The substrate 11 is made of an insulating material such as glass.

An exciting pattern 13 that generates a magnetic field, a magnetic thin film pattern 15 for detection that is disposed adjacent to the exciting pattern, and a detection coil pattern 17 that is disposed adjacent to the magnetic thin film pattern 15 for detection are disposed on the substrate 11. In particular, the exciting pattern 13, the magnetic thin film pattern 15 for detection, and the detection coil pattern 17 described above are disposed flatly on the substrate 11.

As shown in FIGS. 1 to 3, in this embodiment, the magnetic thin film pattern 15 for detection includes a plurality of magnetic thin film portions 151 disposed on the substrate 11. The plurality of magnetic thin film portions 151 each have a rectangular shape and are arranged side by side in one direction of the substrate 11 at intervals. In the first embodiment, the exciting pattern 13 includes a plurality of rectangular stripe portions 131 disposed between the plurality of magnetic thin film portions 151. Therefore, the stripe portions 131 of the exciting pattern 13 and the plurality of rectangular magnetic thin film portions 151 are alternately arranged on the substrate.

For example, the plurality of stripe portions 131 may be formed from a single strip-like member extending along the plurality of magnetic thin film portions 151. More particularly, the strip-like member is disposed in a zig-zag pattern so as to thread through the plurality of magnetic thin film portions 151 (see FIG. 2). Specifically, the strip-like member is disposed so as to extend along a side surface of a first one of the plurality of magnetic thin film portions 151 and pass over a first end of the first one of the magnetic thin film portions 151. Then, the strip-like member passes between the first one of the magnetic thin film portions 151 and a second one of the magnetic thin film portions 151 adjacent to the first one and passes over a second end of the second one of the magnetic thin film portions 151 that is located opposite to the first end of the first one of the magnetic thin film portions 151.

Each of the stripe portions 131 of the exciting pattern 13 is made of an ordinary metal material such as Al, Cu, or Au. In each of the stripe portions 131, the thickness thereof is set to 0.1 to 50 μm and particularly about 1 to about 20 μm; the horizontal dimension (width) thereof is set to 5 to 50 μm and particularly about 5 to about 20 μm; and the lengthwise dimension (length) thereof is set to 80 to 1,000 μm and particularly about 100 to about 800 μm.

The plurality of stripe portions 131 formed as above are arranged on the substrate 11 with a pitch of 10 to 100 μm and particularly about 10 to about 50 μm. In this case, no limitation is imposed on the number of the stripe portions 131 so long as it is equal to or greater than two. However, in terms of magnetic sensitivity, the number of the stripe portions 131 is two or more and particularly preferably about 3 to about 20.

The plurality of stripe portions 131 are connected to each other in series. If the stripe portions 131 are formed from a single strip-like member, they are not required to be connected in the manner described above. A stripe assembly is formed by connecting the plurality of stripe portions 131 to one another as described above. One and the other ends of the stripe assembly are connected to electrodes 135 through respective leads 133, and a DC or AC power source (not shown) is connected to the pair of electrodes 135. In this embodiment, an alternating current, for example, is applied to the exciting pattern 13.

The magnetic thin film portions 151 are each made of a soft magnetic material such as a permalloy or an amorphous material and formed into a rectangular shape, and the dimensions thereof and the pitch (the distance between the magnetic thin film portions 151) are substantially the same as those of the above stripe portions 131 of the exciting pattern 13. Specifically, the thickness is set to about 1 to about 50 μm and particularly to about 5 to about 20 μm, and the length is set to 80 to 1,000 μm and particularly to about 100 to about 800 μm.

In each of the magnetic thin film portions 151 formed as above, a sensitive axis is aligned in the lengthwise direction thereof. No particular limitation is imposed on the number of the magnetic thin film portions 151 so long as it is equal to or greater than 2. Preferably, in terms of magnetic field detection sensitivity, the number of the magnetic thin film portions 151 is set to normally about 2 to about 100 and particularly about 3 to about 20. Preferably, the pitch of the plurality of disposed magnetic thin film portions 151 (the distance between adjacent magnetic thin film portions) is set to about 10 to about 100 μm and particularly about 10 to about 50 μm.

The detection coil pattern 17 includes: first conductive bodies 161 disposed on the substrate 11; and second conductive bodies 171 disposed above the stripe portions 131 and the magnetic thin film portions 151. The first and second conductive bodies together form a detection coil and each have a slim rectangular shape. Each of the first conductive bodies 161 is disposed to face a corresponding one of the second conductive bodies 171 (see FIG. 1). The first conductive bodies 161 and the second conductive bodies 171 are disposed to intersect the arrangement direction of the plurality of stripe portions 131 and the plurality of magnetic thin film portions 151, for example, so as to extend in a direction substantially orthogonal to the arrangement direction (see FIGS. 1 and 2). The first conductive bodies 161 and the second conductive bodies 171 are connected to one another at their opposite ends by suitable means such as an adhesive (see FIG. 1).

The material, dimensions such as thickness, pitch, and the like of each of the first conductive bodies 161 and the second conductive bodies 171 are substantially the same as those of the stripe portions 131 for excitation. Each of the first conductive bodies 161 and the second conductive bodies 171 is made of an ordinary metal material such as Al and is formed as a strip-like body having a thickness of 0.1 to 50 μm and particularly about 2 to about 20 μm, a horizontal dimension (width) of 2 to 60 μm and particularly about 5 to about 20 μm, and a length of 80 to 1,000 μm and particularly about 100 to about 800 μm. The slim first conductive bodies 161 formed as above are arranged with a pitch of 2 to 50 μm and particularly about 5 to about 20 μm, and the slim second conductive bodies 171 formed as above are also arranged with a pitch of 2 to 50 μm and particularly about 5 to about 20 μm. In this case, the numbers of the first conductive bodies 161 and the second conductive bodies 171 are not limited so long as they are equal to or greater than two. However, in terms of the arrangement pattern of their electrodes, particularly of magnetic sensitivity, the numbers are preferably two or more and particularly about 3 to about 20.

In this case, the second conductive bodies 171 of the detection coil pattern 17, in particular, must be disposed so as to be orthogonal to the exciting pattern 13 and the magnetic thin film pattern 15 for detection. In this manner, good magnetic sensitivity characteristics are obtained.

Moreover, suitable insulating thin film layers 12a and 12b must be formed on the inner side of the detection coil pattern 17 so as to cover the exciting pattern 13 and the magnetic thin film pattern 15 for detection.

Figure 4:
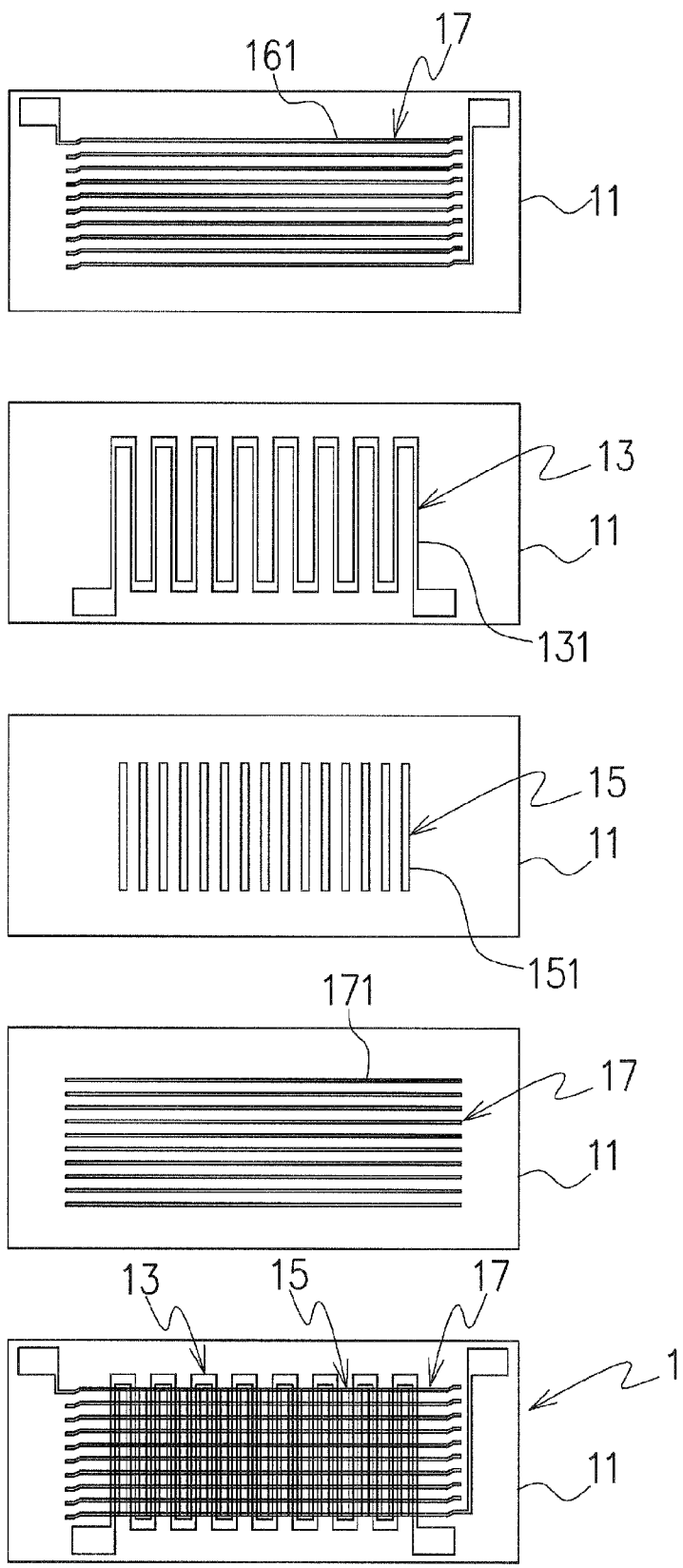
FIG. 4 is a series of exploded plan views of the fluxgate magnetic sensor element according to the first embodiment of the present invention, the magnetic sensor element being shown exploded into its main constituent parts.

The magnetic sensor element described above may be produced according to an ordinary semiconductor process as shown in FIG. 4. Specifically, as shown in FIG. 4, the first conductive bodies 161 of the detection coil pattern 17 are disposed on the substrate 11, and the exciting pattern 13 and the magnetic thin film pattern 15 for detection are disposed on the first conductive bodies 161 through the insulating thin film layer 12a. Subsequently, the second conductive bodies 171 of the detection coil pattern 17 are disposed on the exciting pattern 13 and the magnetic thin film pattern 15 for detection through the insulating thin film layer 12b. The magnetic sensor element can be produced by stacking the sheets one by one as described above. The fluxgate magnetic sensor element 1 may be produced by forming the exciting pattern 13, the magnetic thin film pattern 15 for detection, and the detection coil pattern 17 on the substrate 11 using a printed circuit process.

Figure 5:
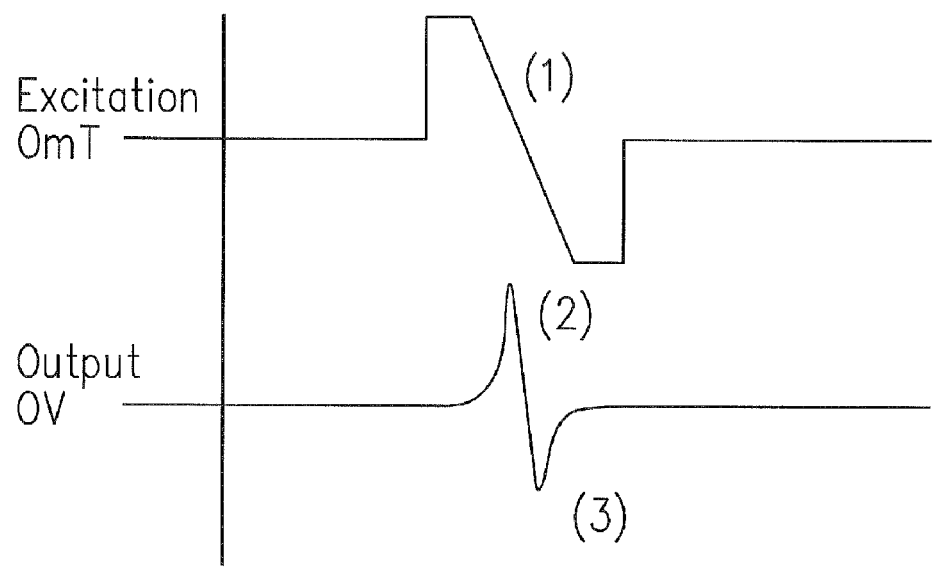
FIG. 5 is a pattern diagram for describing the operating pattern of the fluxgate magnetic sensor element according to the first embodiment of the present invention.

In the above configuration, when an alternating current is applied to the electrodes of the exciting pattern 13 from a power source, the polarity change (1) of the applied magnetic field occurs, and, accordingly, the magnetization to the magnetic thin film pattern 15 for detection in its lengthwise direction is changed. Therefore, electromotive forces (2) and (3) are generated in the detection coil, and the output current of the detection coil pattern 17 is changed (see FIG. 5). More specifically, by applying the current to the exciting pattern 13, a circular magnetic field is generated about each of the stripe portions 131. The generated magnetic field perpendicularly enters each of the rectangular magnetic thin film portions 151, so that an external magnetic field parallel to the magnetic thin film portions 151 is shielded. Subsequently, the polarity of the exciting current is reversed. In the reversing process, the magnetic field generated by each of the stripe portions 131 becomes zero at a point where the excited magnetic field becomes zero and increases again after the polarity is reversed.

In this case, if an external magnetic field penetrates the rectangular magnetic thin film portions 151 with a peak at zero excited magnetic field, the magnetic field penetrates in the horizontal direction, and therefore an electromotive force corresponding to the strength of the external magnetic field is generated in the detection coil pattern 17.

Therefore, the strength and polarity of the external magnetic field can be determined from the change in the voltage, i.e., the electromotive force.

In the first embodiment, a glass substrate of 1.2 mm×3 mm was used, and the exciting pattern 13 was formed by arranging ten stripe portions 131 having a width of 10 μm and a length of 0.4 mm in a zig-zag pattern. Subsequently, ten magnetic thin film portions 151 each made of a permalloy thin film of a thickness of 0.5 μm and each having a width of 20 μm and a length of 0.4 mm were arranged in parallel with a pitch of 50 μm, whereby the magnetic thin film pattern 15 for detection was formed. Moreover, the detection coil pattern 17 was formed so as to be orthogonal to the exciting pattern 13 and the magnetic thin film pattern 15 for detection. The number, size, and pitch of the detection coil pattern 17 were the same as those of the exciting pattern 13.

Second Embodiment

Figure 6A:
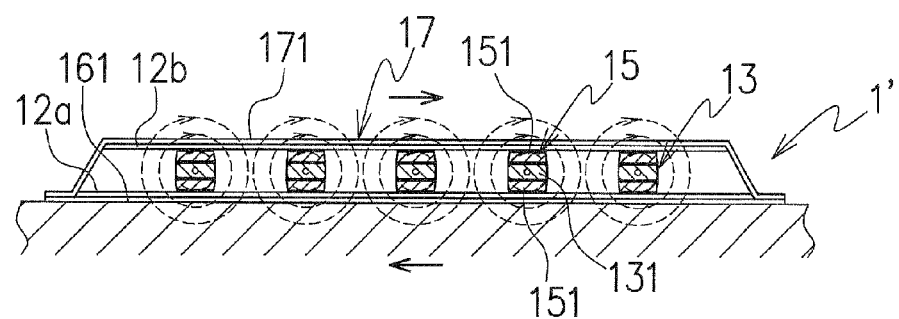
FIG. 6A is a cross-sectional view of a fluxgate magnetic sensor element according to a second embodiment of the present invention.
Figure 6B:
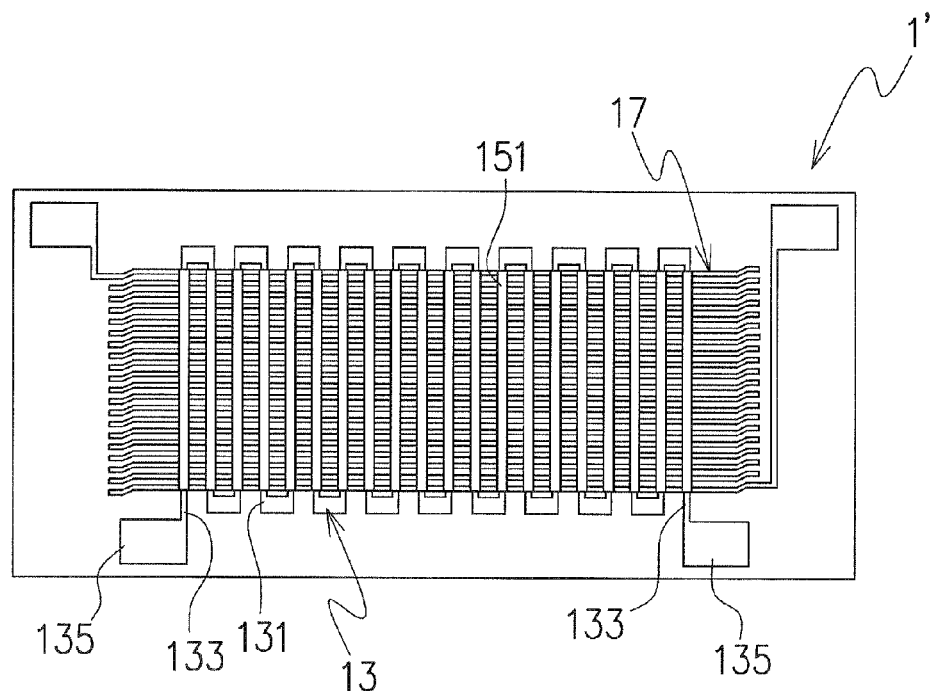
FIG. 6B is a plan view of the fluxgate magnetic sensor element according to the second embodiment of the present invention.

FIGS. 6A and 6B show a second embodiment of the magnetic sensor element according to the present invention.

In the first embodiment described above, the fluxgate magnetic sensor element 1 is formed by disposing the single-layer exciting pattern 13 and the single-layer magnetic thin film pattern 15 for detection so as to be arranged alternately in the left-right direction on the substrate 11. In the second embodiment, a fluxgate magnetic sensor element 1' is formed by vertically arranging the exciting pattern 13 and the magnetic thin film pattern 15 for detection. In this case, any of the patterns may be placed above the other pattern. As shown in the illustrated example, the magnetic thin film pattern 15 for detection may be disposed on opposite vertical sides of the exciting pattern 13. With such a configuration, the sensitivity to magnetism is expected to be further improved, and the current consumption is expected to be further reduced. Not only the magnetic thin film pattern 15 for detection, but also the exciting pattern 13 and the detection coil pattern 17 may be formed into two layers.

Figure 7:
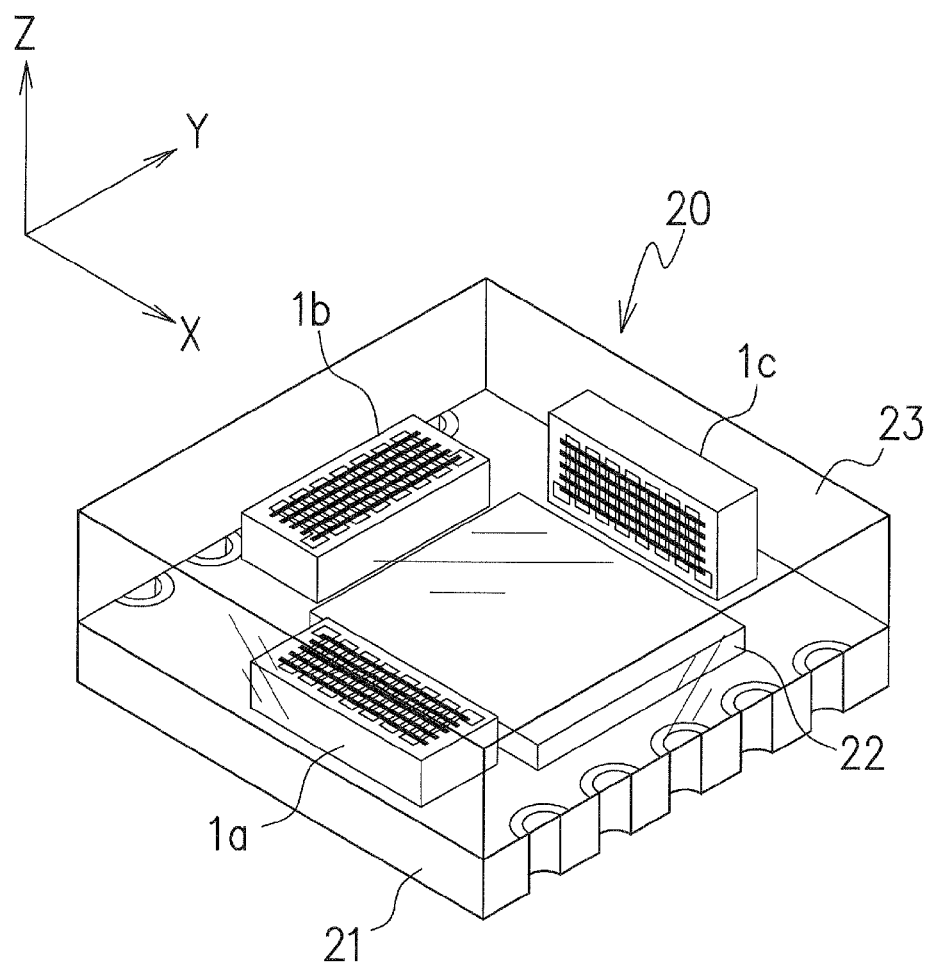
FIG. 7 is a perspective view illustrating an exemplary configuration of a magnetic sensor according to the present invention.

FIG. 7 shows a magnetic sensor 20 in which a plurality of magnetic sensor elements configured as above are installed. In the magnetic sensor 20, an IC 22 is mounted on the upper surface of a rectangular substrate 21 at a central portion of the substrate 21, and three fluxgate magnetic sensor elements 1a, 1b, and 1c are orthogonally disposed on X, Y, and Z axes so as to surround the outer circumference of the IC 22 in three directions. The IC 22 and the fluxgate magnetic sensor elements 1a, 1b, and 1c are encapsulated with a transparent resin 23.

Figure 8:
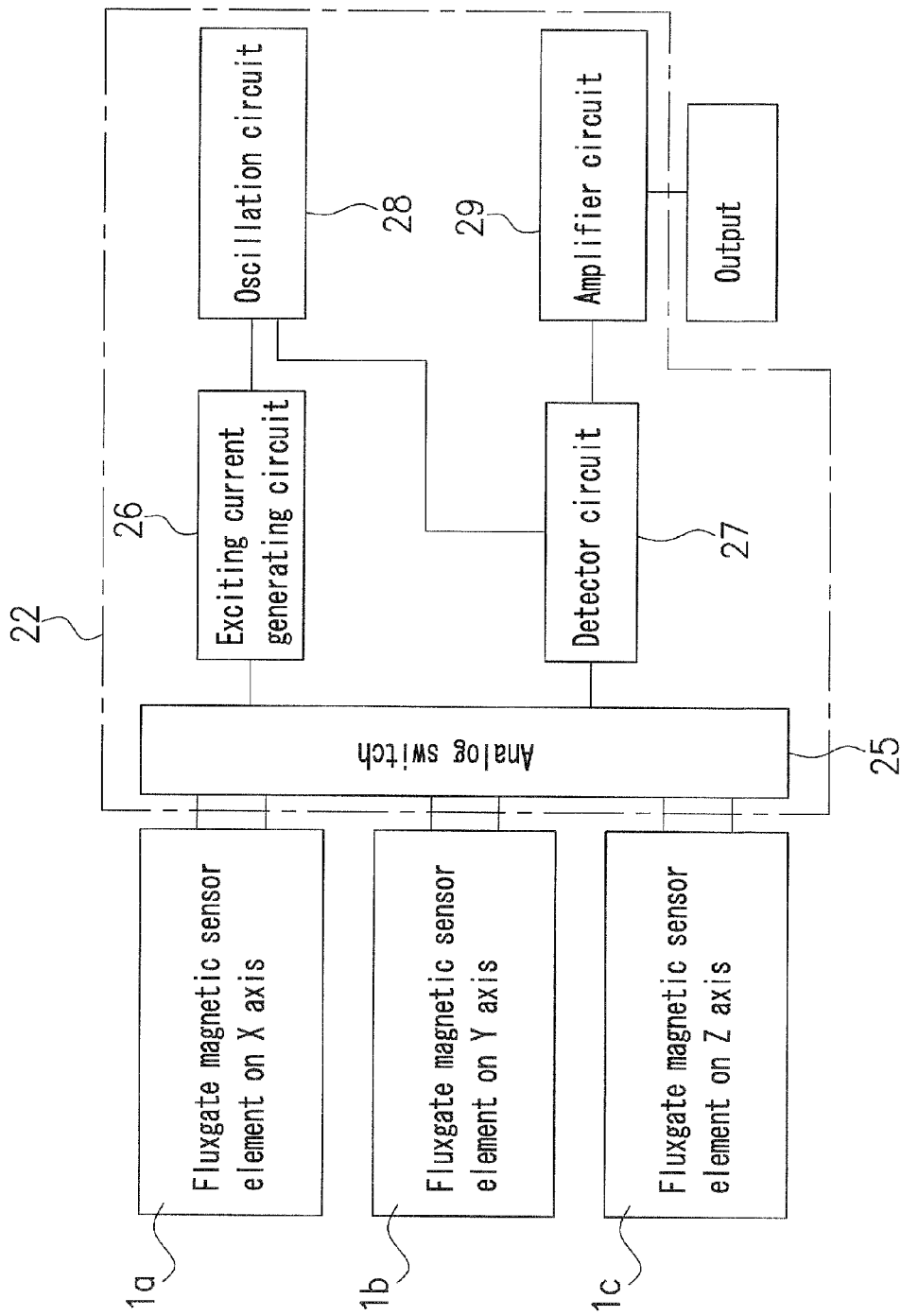
FIG. 8 is a circuit diagram for describing a driving circuit of the magnetic sensor according to the present invention.

FIG. 8 shows a driving circuit of the magnetic sensor 20. An exciting current generating circuit 26 generates a current for the fluxgate magnetic sensor elements 1a, 1b, and 1c on the X, Y, and Z axes at the timing determined by an oscillation circuit 28 in the IC 22. The current is applied to the exciting pattern 13 of a corresponding one of the magnetic sensor elements through an analog switch 25 according to the driving timing of each of the fluxgate magnetic sensor elements 1a, 1b, and 1c. In this configuration, the current generated by the electromotive force generated in the detection coil pattern 17 of each magnetic sensor element is inputted to a detector circuit 27 through the analog switch 25 and another circuit. Then, the current is outputted through the detector circuit 27 and an amplifier circuit 29 at the timing synchronized with the current that is generated by the exciting current generating circuit 26 according to the timing determined by the oscillation circuit 28.

As shown in FIG. 9, an exciting current of 10 mA is applied to each of the fluxgate magnetic sensor elements 1a, 1b, and 1c disposed on the X, Y, and Z axes for 100 μs in a cycle of 750 μs. In this manner, the geomagnetism is properly detected at an average consumption current of 250 μA.

INDUSTRIAL APPLICABILITY

According to the present invention, a magnetic sensor can be realized which is provided with a small and thin fluxgate magnetic sensor element flatly formed using a semiconductor process. During the semiconductor process, a very small detection element can be obtained. Such a fluxgate magnetic sensor element can be used even when a three-axis magnetic sensor is formed.

DESCRIPTION OF THE REFERENCE NUMERALS 1 fluxgate magnetic sensor element
11 substrate
13 exciting pattern
131 stripe portion
135 electrode
15 magnetic thin film pattern for detection
151 magnetic thin film portion
17 detection coil pattern
161 first conductive body
171 second conductive body

The invention claimed is:
1. A magnetic sensor element comprising:
a substrate;

an exciting pattern which is disposed on the substrate to generate a magnetic field;

a magnetic thin film pattern for detection disposed adjacent to the exciting pattern; and a detection coil pattern which is disposed adjacent to the magnetic thin film pattern for detection, wherein:

the magnetic thin film pattern for detection includes a plurality of magnetic thin film portions insulatingly disposed on the substrate;

the exciting pattern includes a plurality of stripe portions which are disposed between the plurality of magnetic thin film portions to generate a magnetic field; and the detection coil pattern includes a plurality of first conductive bodies insulatingly disposed on the substrate and a plurality of second conductive bodies disposed in the detection coil pattern so as to face the first conductive bodies.

2. The magnetic sensor element according to claim 1, wherein the exciting pattern and the magnetic thin film pattern for detection are arranged on the substrate in an alternate manner.

3. The magnetic sensor element according to claim 1, wherein the exciting pattern and the magnetic thin film pattern for detection are vertically layered.

4. The magnetic sensor element according to claim 1, wherein the plurality of magnetic thin film portions comprise at least two rectangular thin film members.

5. The magnetic sensor element according to claim 1, wherein the detection coil pattern comprises a rectangular conductive body wound at least one turn.

6. The magnetic sensor element according to claim 1, wherein at least one of the exciting pattern, the magnetic thin film pattern for detection, and the detection coil pattern comprises two or more layers.

7. A magnetic sensor wherein the magnetic sensor elements according to claim 1 are disposed on mutually orthogonal X, Y, and Z axes.

8. A magnetic sensor element comprising:
a substrate;
an exciting pattern which is disposed on the substrate to generate a magnetic field;
a magnetic thin film pattern for detection disposed adjacent to the exciting pattern; and
a detection coil pattern which is disposed adjacent to the magnetic thin film pattern for detection, wherein:
the magnetic thin film pattern for detection includes a plurality of magnetic thin film portions insulatingly disposed on the substrate;
the exciting pattern includes a plurality of stripe portions which are disposed between the plurality of magnetic thin film portions to generate a magnetic field; and
the detection coil pattern includes a plurality of first conductive bodies insulatingly disposed on the substrate and a plurality of second conductive bodies disposed in the detection coil pattern so as to face the first conductive bodies;
wherein a sensitive axis is aligned in a lengthwise direction of each of the magnetic thin film portions.

9. A magnetic sensor element comprising:
a substrate;
an exciting pattern which is disposed on the substrate to generate a magnetic field;
a magnetic thin film pattern for detection disposed adjacent to the exciting pattern; and
a detection coil pattern which is disposed adjacent to the magnetic thin film pattern for detection, wherein:
the magnetic thin film pattern for detection includes a plurality of magnetic thin film portions insulatingly disposed on the substrate;
the exciting pattern includes a plurality of stripe portions which are disposed between the plurality of magnetic thin film portions to generate a magnetic field; and
the detection coil pattern includes a plurality of first conductive bodies insulatingly disposed on the substrate and a plurality of second conductive bodies disposed in the detection coil pattern so as to face the first conductive bodies;
wherein
(1) the plurality of stripe portions are formed from a single strip-like member continuously extending along a circumference of each of the plurality of magnetic thin film portions;
or
(2) the plurality of magnetic thin film portions are arranged side by side in one direction of the substrate, and the first conductive bodies and the second conductive bodies are arranged to intersect the one direction of the substrate.

10. The magnetic sensor element according to claim 9, wherein the plurality of stripe portions are formed from a single strip-like member continuously extending along a circumference of each of the plurality of magnetic thin film portions.

11. The magnetic sensor element according to claim 9, wherein: the plurality of magnetic thin film portions are arranged side by side in one direction of the substrate; and the first conductive bodies and the second conductive bodies are arranged to intersect the one direction of the substrate.

\* \* \* \* \*